US008619755B2

(12) United States Patent
Wang et al.

(10) Patent No.: US 8,619,755 B2
(45) Date of Patent: Dec. 31, 2013

(54) SYSTEMS AND METHODS FOR PROVIDING A DUAL-MASTER MODE IN A SYNCHRONOUS ETHERNET ENVIRONMENT

(75) Inventors: Peiqing Wang, Laguna Beach, CA (US); Linghsiao Wang, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 382 days.

(21) Appl. No.: 12/983,600

(22) Filed: Jan. 3, 2011

(65) Prior Publication Data
US 2012/0063296 A1 Mar. 15, 2012

Related U.S. Application Data

(60) Provisional application No. 61/381,829, filed on Sep. 10, 2010.

(51) Int. Cl.
| H04J 3/06 | (2006.01) |
| H04L 12/28 | (2006.01) |
| H04L 7/04 | (2006.01) |
| H03D 3/24 | (2006.01) |

(52) U.S. Cl.
USPC ...... 370/350; 370/395.62; 370/516; 375/362; 375/373; 375/376

(58) Field of Classification Search
USPC ............. 370/395.62, 516; 375/354–357, 362, 375/373, 376
See application file for complete search history.

(56) References Cited

U.S. PATENT DOCUMENTS

| 6,687,320 | B1 * | 2/2004 | Chiu et al. ................... 375/376 |
| 7,577,226 | B2 * | 8/2009 | Sou ............................... 375/376 |
| 7,649,910 | B1 * | 1/2010 | Wechsler et al. ............. 370/503 |
| 8,284,794 | B2 * | 10/2012 | Yu et al. ........................ 370/464 |
| 2007/0025483 | A1 * | 2/2007 | Emami-Neyestanak et al. ............................ 375/355 |
| 2007/0041485 | A1 * | 2/2007 | Chang .......................... 375/376 |
| 2008/0159270 | A1 * | 7/2008 | Burke et al. .................. 370/352 |
| 2009/0015304 | A1 * | 1/2009 | Yin et al. ...................... 327/162 |

* cited by examiner

*Primary Examiner* — Redentor Pasia
(74) *Attorney, Agent, or Firm* — Sterne, Kessler, Goldstein & Fox P.L.L.C.

(57) ABSTRACT

Embodiments of a dual-master mode Ethernet node are provided herein. The dual-master mode Ethernet node includes a first multiplexer configured to select between a local oscillator signal and a primary reference source (PRS) signal to provide a reference clock signal, a digital phase-locked loop (DPLL) configured to generate a master clock signal based on the reference clock signal, a phase rotator configured to rotate a phase of the master clock signal based on a frequency error between the master clock signal and an extracted clock signal to generate a slave clock signal, and a second multiplexer configured to select between the master clock signal and the slave clock signal to provide a transmit clock signal. The dual-master mode Ethernet node can dynamically generate the transmit clock based on either the extracted clock or the PRS without re-performing the auto-negotiation process.

19 Claims, 4 Drawing Sheets

SYSTEMS AND METHODS FOR PROVIDING A DUAL-MASTER MODE IN A SYNCHRONOUS ETHERNET ENVIRONMENT

CROSS-REFERENCE TO RELATED APPLICATION

This application claims the benefit of U.S. Provisional Patent Application No. 61/381,829, filed Sep. 10, 2010, entitled "System and Methods for Providing a Dual-Master Mode in a Synchronous Ethernet Environment," which is incorporated herein by reference in its entirety.

FIELD OF THE INVENTION

This application relates generally to Ethernet communication systems and more particularly to Synchronous Ethernet (SyncE) communication systems.

BACKGROUND

Because of its low cost and ease of use, Ethernet has become a favored technology for data transmission applications. In particular, telecom and wireless providers have begun to favor Ethernet in many of their core networks because of its associated benefits. However, many telecom systems are based on time division multiplexing (TDM), which works best in networks that can provide constant bit rate traffic for transmitting delay sensitive data such as voice and video, for example. The asynchronous nature of traditional Ethernet is not well suited for providing constant bit rate traffic. Without synchronization between communicating nodes (like in traditional Ethernet), variations in each nodes transmission frequency can cause overflow and underflow of data packets at a receiver.

One common way to achieve synchronization over Ethernet is Synchronous Ethernet (SyncE). SyncE architectures are described in ITU_T recommendations G.8261 and G.813. SyncE provides a mechanism to pass timing from node to node over the Ethernet physical layer. This mechanism gives telecom and wireless providers some assurance that networks based on SyncE can reliably perform in their delay sensitive networks.

SyncE implements the master/slave concept used in traditional Ethernet to pass timing from node to node. In traditional Ethernet, two communicating nodes operating under the master/slave concept are initially designated as master and slave, respectively. This designation occurs during the auto-negotiation process. During communication between the two nodes, the master generates a transmit clock locally from a free-running crystal oscillator and the slave recovers the master clock from data received from the master. The slave uses the recovered clock to transmit its own data.

For SyncE, the same master/slave concept is used to pass timing from node to node. However, the master/slave concept only allows timing to be passed in one direction between two communicating nodes; that is, from master to slave. The direction in which timing is passed cannot be dynamically switched between two communicating nodes without re-performing the auto-negotiation process. In order to guarantee a high reliability in SyncE networks transporting delay sensitive data, bi-directional delivery of timing between two communicating nodes should be possible without having to re-perform the auto-negotiation process, which can add significant delay and may result in an unacceptable link drop.

Therefore, what is needed is a system and method for allowing an Ethernet node to dynamically switch between master and slave designations without requiring the auto-negotiation process to be re-performed.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Figure 1:
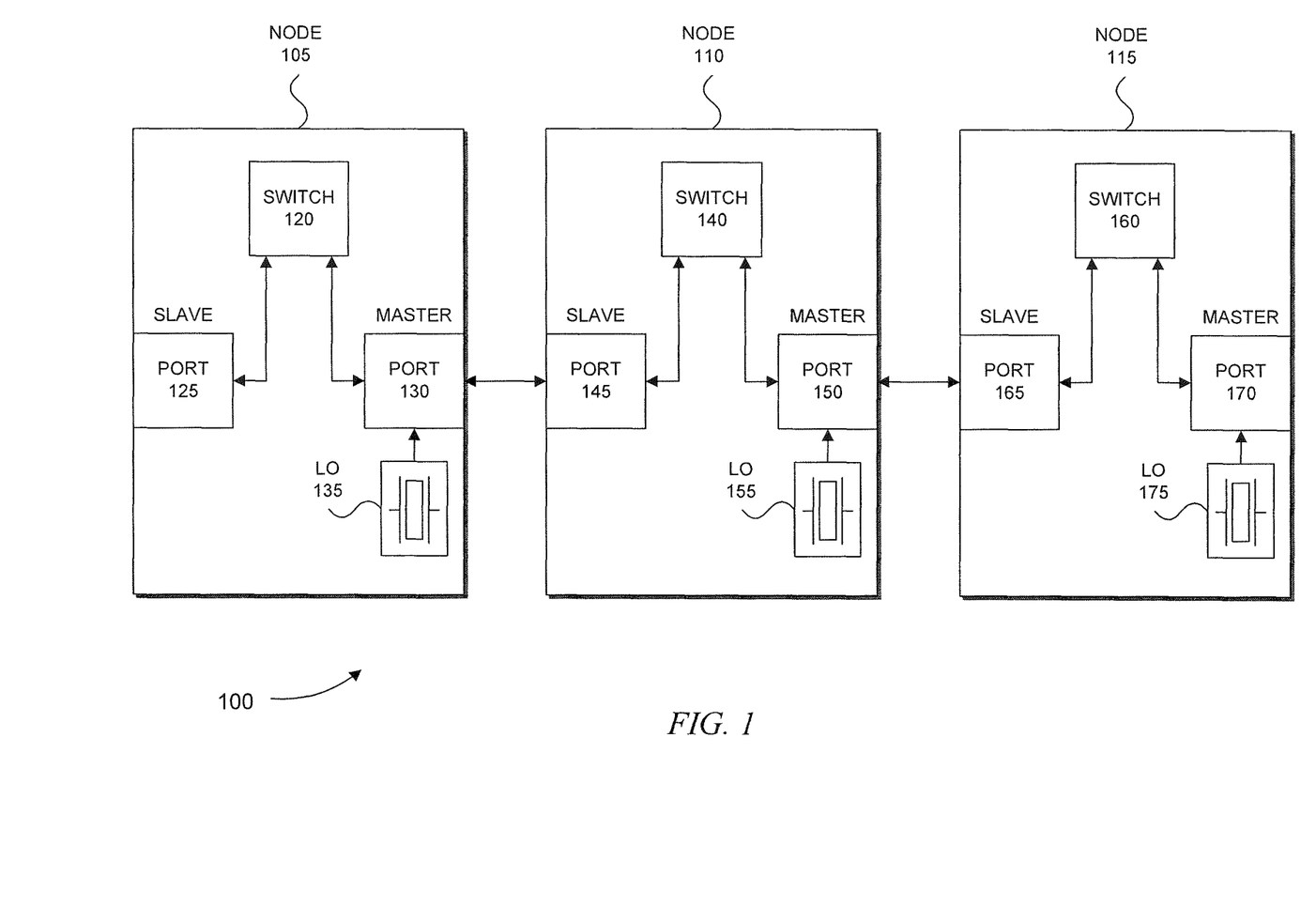
FIG. 1 illustrates the master/slave concept as used in a traditional Ethernet network.

FIG. 1 illustrates the master/slave concept as used in a traditional Ethernet network 100 according to embodiments of the present invention. The traditional Ethernet network 100 of FIG. 1, as defined by the IEEE 802.3 standard, has no requirement to synchronize Ethernet nodes in communication. Rather, data is intended to be transmitted asynchronously.

However, in some Ethernet types, such as Gigabit Ethernet over copper (1000Base-T), the frequency at which data is transmitted between two nodes is made identical. This identical transmission frequency between two nodes in a Gigabit Ethernet network is generally mandated because transmission is done in both directions simultaneously, unlike in other Ethernet types, such as 10Base-T, where data is transmitted in one direction at a time.

Although simultaneous communication in both directions can enable faster data rates, cross-talk between a PHY's transmitter and receiver becomes an issue. In general, an Ethernet PHY's transmission signal is much more powerful than the weak signals it typically receives. Because transmission lines that are respectively coupled to an Ethernet PHY's transmitter and receiver are generally close to each other, they are susceptible to cross-talk interference. In particular, the receiver of an Ethernet PHY can become saturated with near end cross-talk noise from its own transmitter.

One approach to combat near end cross-talk noise and improve SNR is echo cancellation. However, echo cancellation generally performs more efficiently if the transmitter and receiver are sending and receiving data respectively using a common clock. Thus, in Gigabit Ethernet systems, two PHYs in communication transmit data according to an identical frequency.

In order to synchronize their transmit frequencies, two Gigabit Ethernet PHYs in communication establish a master-slave relationship through an auto-negotiation process. Specifically, the two Gigabit Ethernet PHYs during an initial period of communication negotiate and then agree on their respective status as an 802.3 master and an 802.3 slave. The Gigabit Ethernet PHY established as the 802.3 master provides the clock in which each transmitter of the two respective Gigabit Ethernet PHYs transmit data according to. In other words, the slave Gigabit Ethernet PHY locks on to the transmitter clock of the master Gigabit Ethernet PHY and transmits data according to that clock. As noted above, using a common clock for the transmission of data increases the effectiveness of echo cancellation in removing cross-talk noise generated between a PHY's transmitter and receiver.

FIG. 1 illustrates three Ethernet nodes 105, 110, and 115 in traditional Ethernet network 100, where Ethernet node 105 is in communication with Ethernet node 110, and Ethernet node 110 is in communication with Ethernet node 115. In an embodiment, the three Ethernet nodes 105, 110, and 115 are configured to operate in the context of a master/slave relationship as described above.

Each Ethernet node 105, 110, and 115 includes a respective switch, two ports, and a local oscillator. Specifically, Ethernet node 105 includes switch 120, ports 125 and 130, and local oscillator 135. Ethernet node 110 includes switch 140, ports 145 and 150, and local oscillator 155. Ethernet node 115 includes switch 160, ports 165 and 170, and local oscillator 175.

Before Ethernet nodes 105 and 110 can communicate via ports 130 and 145, the auto-negotiation process between these two nodes is performed. During the auto-negotiation process, the PHY associated with port 130 is designated as the 802.3 master and the PHY associated with port 145 is designated as the 802.3 slave. Thus, as the 802.3 master, the PHY associated with port 130 provides the clock, from its free-running local oscillator 135, in which each transmitter of the two respective ports 130 and 145 transmit data according to. The slave PHY of port 145 locks on and extracts the transmitter clock, using a clock recovery module, from a data stream transmitted to port 145 from port 130. The extracted clock is then used by the slave PHY of port 145 for transmitting data to port 130.

Similar to the above, before Ethernet nodes 110 and 115 can communicate via ports 150 and 165, the auto-negotiation process between these two nodes is performed. During the auto-negotiation process, the PHY associated with port 150 is designated as the 802.3 master and the PHY associated with port 165 is designated as the 802.3 slave. Thus, as the 802.3 master, the PHY associated with port 150 provides the clock, from its free-running local oscillator 155, in which each transmitter of the two respective ports 150 and 165 transmit data according to. The slave PHY of port 165 locks on and extracts the transmitter clock, using a clock recovery module, from a data stream transmitted to port 165 from port 150. The extracted clock is then used by the slave PHY of port 165 for transmitting data to port 150.

FIG. 1 illustrates that synchronization to the same clock can exist on each hop between two adjacent nodes in traditional Gigabit Ethernet networks. However, synchronization to the same clock does not exist from hop to hop. For example, although communication over the first hop between nodes 105 and 110 is synchronized to the same clock (i.e., to the free-running clock of local oscillator 135), communication over the second hop between nodes 110 and 115 is not synchronized to the same clock as the first hop. Rather, communication over the second hop between nodes 110 and 115 is synchronized to the free-running clock of local oscillator 155 in the intermediate node 110. In telecom networks based on time division multiplexing (TDM) hop to hop synchronization is required. Thus, traditional Ethernet network 100 is generally inadequate for such networks.

Figure 2:
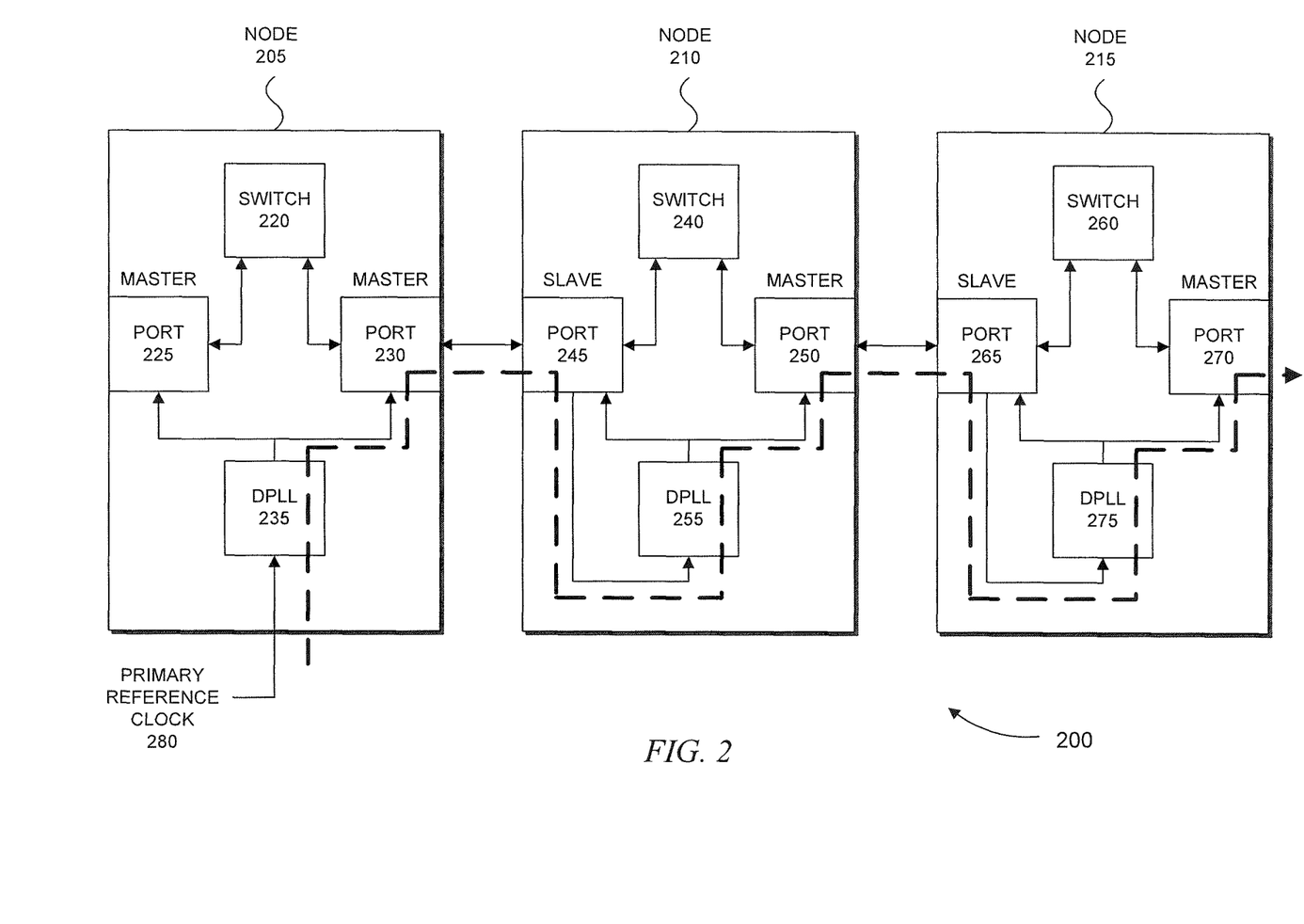
FIG. 2 illustrates the master/slave concept as used in a SyncE Ethernet network.

One way to achieve synchronization over Ethernet is Synchronous Ethernet (SyncE). The SyncE architectures are described in ITU_T recommendations G.8261 and G.813. SyncE provides a mechanism to pass timing from node to node over the Ethernet physical layer. This mechanism gives telecom and wireless providers some assurance that networks based on SyncE can reliably perform in their delay sensitive networks. FIG. 2, described further below, illustrates the 802.3 master/slave concept as used in a SyncE Ethernet network 200.

As illustrated in FIG. 2, passing timing from node to node is fairly straightforward. Rather than each 802.3 master generating a transmit clock from its own free-running crystal oscillator, like the master PHYs in FIG. 1, the master PHYs in a SyncE network can use the recovered clock from one Ethernet node and pass the same clock to all other Ethernet nodes.

FIG. 2 specifically illustrates three Ethernet nodes 205, 210, and 215 operating in such a manner. Each Ethernet node 205, 210, and 215 includes a respective switch, two ports, and a digital phase-locked loop (DPLL). Specifically, Ethernet node 205 includes switch 220, ports 225 and 230, and DPLL 235. Ethernet node 210 includes switch 240, ports 245 and 250, and DPLL 255. Ethernet node 215 includes switch 260, ports 265 and 270, and DPLL 275.

Before Ethernet nodes 205, 210, and 215 can communicate, the auto-negotiation process between these three nodes is performed. Specifically, during auto-negotiation between Ethernet nodes 205 and 210, the PHY associated with port 230 is designated as the 802.3 master and the PHY associated with port 245 is designated as the 802.3 slave. Similarly, during auto-negotiation between Ethernet nodes 210 and 215, the PHY associated port 250 is designated as the 802.3 master and the PHY associated with port 265 is designated as the 802.3 slave.

In operation, Ethernet node 205 receives a primary reference clock (PRC) or primary reference source (PRS) 280 at an input node. PRC or PRS 280 is a highly accurate clock that can be generated from several sources, including a cesium clock or from cesium-clock controlled radio signals. PRC 280 can be distributed through a network to provide global synchronization. It should be noted, however, that other clock sources can be distributed and used throughout a network to achieve synchronization other than PRC 280.

PRC 280 is cleaned by DPLL 235 to remove jitter. After being cleaned, PRC 280 is used as the transmit clock by the master PHY associated with port 230. Accordingly, data transmitted by the master PHY associated with port 230 is transmitted according to PRC 280. The slave PHY associated with port 245 locks on and extracts the transmitter clock, using a clock recovery module, from a data stream transmitted to port 245 from port 230. The extracted clock is then used by the slave PHY of port 245 for transmitting data to port 230.

In addition, the extracted clock, after being cleaned by DPLL 255 to remove jitter, is used by the master PHY associated with port 250 as the transmit clock for transmitting data to the slave PHY associated with port 265. The slave PHY associated with port 265 locks on and extracts the transmitter clock, using a clock recovery module, from a data stream transmitted to port 265 from port 250. The extracted clock is then used by the slave PHY of port 265 for transmitting data to port 250. In addition, the extracted clock can be further passed along to other Ethernet nodes by the master PHY associated with port 270 after being cleaned by DPLL 275 to remove jitter.

It is in the manner described above that multiple Ethernet nodes, such as nodes 205, 210, and 215, can be synchronized such that they transmit data according to a single clock (e.g., to PRC 280).

One potential issue with SyncE is that PRC 280 can become disconnected from Ethernet node 205. As a result, extracted PRC 280 at Ethernet nodes 210 and 215 can deteriorate, causing the extracted clock at DPLLs 255 and 275 to either stop or drift in frequency. Eventually, the extracted clock at Ethernet nodes 210 and 215, and at nodes further down the chain, can deteriorate past the point where the clock signal is no longer usable. At this point the entire link, formed by the connected Ethernet nodes, can be dropped.

Although PRC 280 may be received directly or from another Ethernet node without interruption at Ethernet node 210, the 802.3 master/slave concept only allows timing to passed in one direction between two communicating nodes; that is, from master to slave. The direction in which timing is passed cannot be dynamically switched between two communicating Ethernet nodes, such as Ethernet nodes 205 and 210, without re-performing the auto-negotiation process.

In order to guarantee a high reliability in SyncE networks transporting delay sensitive data, bi-directional delivery of timing between two communicating nodes should be possible without having to re-perform the auto-negotiation process, which can add significant delay and may result in an unacceptable link drop. For example, it should be possible for Ethernet node 210 to use its PRC received from an external source in the event Ethernet node 205 becomes disconnected from PRC 280. This switchover can occur based on a predetermined deterioration of the extracted PRC 280 at Ethernet node 210. For example, deterioration of the extracted PRC 280 may be recognized by DPLL 255 as a drift in the frequency of extracted PRC 280.

Embodiments of the present invention include systems and methods for allowing an Ethernet node to dynamically switch between effectively operating as a master and slave without requiring the auto-negotiation process to be re-performed. In particular, embodiments include a new transmit clock generation architecture for an Ethernet PHY that is configured to extract and use a clock signal from its down stream path irrespective of its initial designation as an 802.3 master or 802.3 slave and without having to re-perform the auto-negotiation process. Because two PHYs configured in this manner and in communication with each other can both be "masters" at any given time, this new transmit clock generation architecture can be referred to as a dual-master mode architecture.

This new dual-master mode architecture does not change the standard 802.3 master/salve designation of an Ethernet node after the auto-negotiation process has been performed. Rather, if after auto-negotiation an Ethernet node is designated as an 802.3 master and the Ethernet node is subsequently switched by the new dual-master mode architecture to begin extracting and using a clock signal from its own downstream path to transmit data, the status of the 802.3 master is further referred to as a timing slave—even though it remains designated as an 802.3 master. Similarly, if after auto-negotiation an Ethernet node is designated as an 802.3 slave and the Ethernet node is subsequently switched by the new dual-master mode architecture to begin transmitting data according to its own internal clock or a PRC it receives, the status of the 802.3 slave is further referred to as a timing master—even though it remains designated as an 802.3 slave. Thus, the new dual-master mode architecture introduces the concept of a timing master and a timing slave.

Figure 3:
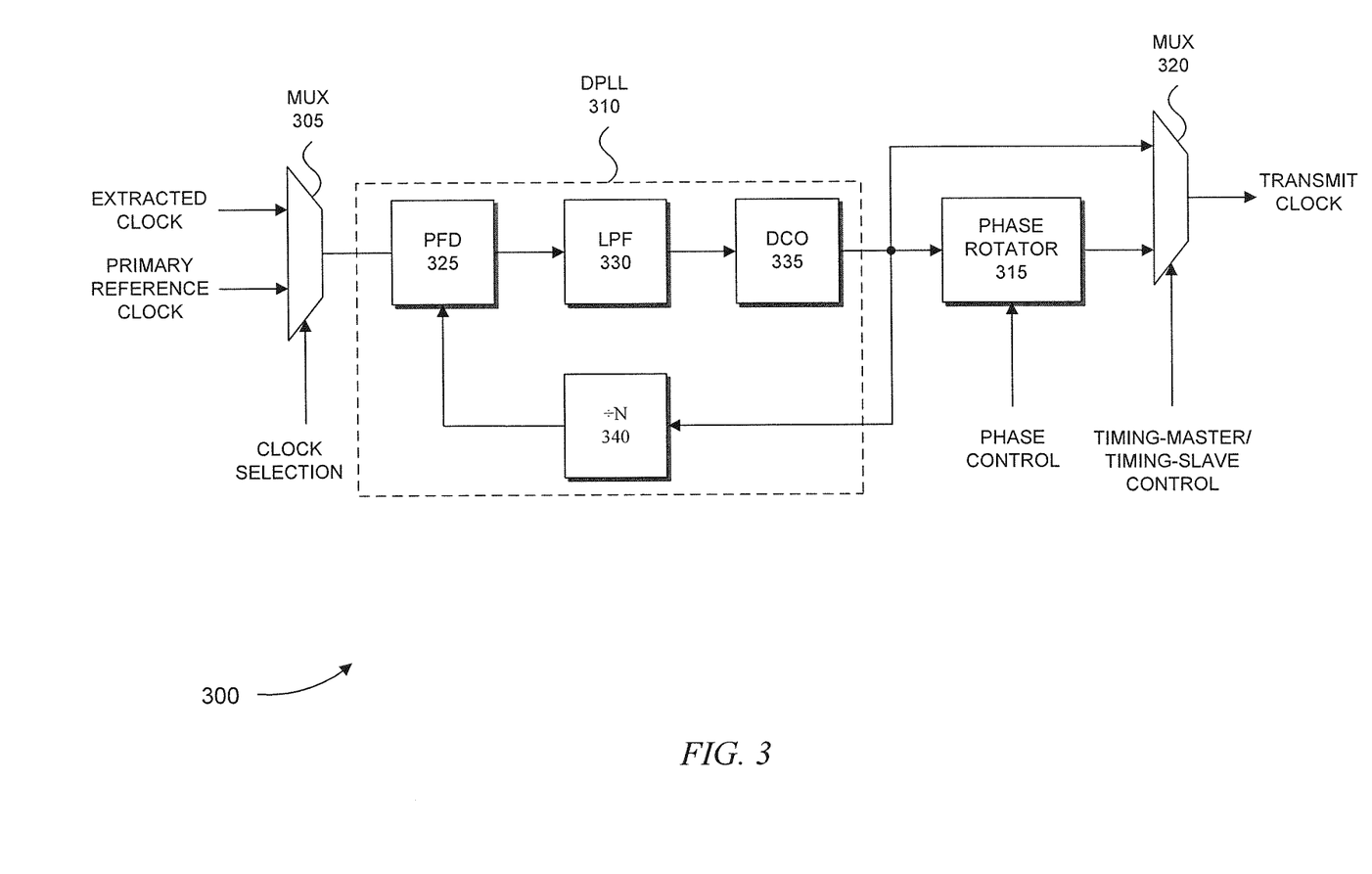
FIG. 3 illustrates a transmit clock generation module for a dual-master mode Ethernet node that can dynamically generate a transmit clock based on either an extracted clock or a primary reference source without re-performing the auto-negotiation process, according to embodiments of the present invention.

FIG. 3 illustrates one example of a transmit clock generation module 300 for a dual-master mode Ethernet node, operating in a SyncE network, that can dynamically generate a transmit clock based on either an extracted clock or a primary reference source without re-performing the auto-negotiation process, according to embodiments of the present invention.

As illustrated in FIG. 3, transmit clock generation module 300 includes a first multiplexer 305, a DPLL 310, a phase rotator 315, and a second multiplexer 320. In operation, first multiplexer 305 selects between an extracted clock signal, recovered from a downstream data signal received by the Ethernet node in which transmit clock generation module 300 is implemented, or a primary reference clock (PRC) signal or primary reference source (PRS), also received by the Ethernet node in which transmit clock generation module 300 is implemented. The PRC signal is a highly accurate clock that can be generated from several sources, including a cesium clock or from cesium-clock controlled radio signals. The PRC signal can be distributed through a network to provide global synchronization. It should be noted, however, that other clock sources can be distributed and used throughout a network to achieve synchronization other than the PRC signal.

Multiplexer 305 is configured to make the selection between the extracted clock signal and the PRC signal based on a clock selection signal to provide a reference clock signal as output. In an embodiment, the clock selection signal is generated by control logic (not shown) that may function according to a finite state machine, for example. During communication, the PRC signal is selected if the Ethernet node, in which transmit clock generation module 300 is implemented, is operating as a timing master. In the event that the PRC signal deteriorates or becomes disconnected from the Ethernet node in which transmit clock generation module 300 is implemented, the extracted clock signal can be selected, and the Ethernet node will become a timing slave. In an embodiment, DPLL 310 determines if the PRC signal deteriorates and/or becomes disconnected and signals to the control logic (not shown) to switch over to the extracted clock signal in such an event.

Assuming the Ethernet node implementing transmit clock generation module 300 is operating as a timing master, the PRC signal will be selected by first multiplexer 305 and the PRC signal will be passed to DPLL 310. In general, DPLL 310 is configured to remove jitter from the PRC signal such that a clean, intermediate clock signal is provided at its output that can be used as a master clock signal. In other words, the intermediate clock signal provided at the output of DPLL 310 can be used as the transmit clock signal for the Ethernet node currently operating as a timing master.

DPLL 310 includes a phase-frequency detector (PFD) 325, a low-pass filter 330, a digitally controlled oscillator (DCO) 335, and a divide by N module 340. PFD 325 compares the phase of the oscillator output of DCO 335, after having been divided by a factor of N by divide by N module 340, to the PRC signal. The signal from PFD 325 represents an error in phase between the two compared signals. Low-pass filter 330 is configured to provide a simple proportion (i.e., a gain or attenuation) correction of the phase error signal generated by PFD 325.

Conventional DPLLs implemented in Ethernet nodes within a SyncE network typically include a low-pass filter that provides both a proportion (i.e., a gain or attenuation) and integral (i.e., low-pass filter response) correction of the phase error signal generated by a PFD, such as PFD 325. However, because of the high quality reference clock provide by the PRC signal, which is typically required to have a frequency accuracy within +/−4.6 ppm, DPLL 310 can track the frequency of the PRC signal without the integral portion of low-pass filter 330. Removal of the integral correction allows the Ethernet node containing transmit clock generation module to smoothly transition from using its own master clock to transmit data, to using an extracted clock to transmit data. In other words, removal of the integral correction allows the Ethernet node to smoothly transition from being a timing master to a timing slave, or vice-versa.

After being processed by low-pass filter 330, the phase error signal is used to adjust DCO 335 to provide the intermediate clock signal at its output. The intermediate clock signal is phase aligned with the PRC signal. Because the PRC signal was selected by multiplexer 305 and feed into DPLL 310 in this instance, where the Ethernet node is operating as a timing master, the intermediate clock signal may be more appropriately referred to as the master clock signal.

DPLL 310 is configured to provide the same functionality discussed above if the extracted clock signal is selected by multiplexer 305, as opposed to the PRC signal. The extracted clock signal, as noted above, is selected when the Ethernet node, implementing transmit clock generation module 300, is operating as a timing slave.

Phase rotator 315 is configured to receive the intermediate clock signal provided at the output of DPLL 310 and is configured to adjust the intermediate clock signal for any frequency offset between it and the extracted clock signal recovered from data transmitted from a remote Ethernet node. In general, the output of phase rotator 315 is only used when the Ethernet node, implementing transmit clock generation module 300, is operating as a timing slave. The output of phase rotator 315 represents a slave clock signal that is phase and frequency locked to the extracted clock signal from the remote Ethernet node.

The frequency error provided to phase rotator 315 can be determined through well-known methods. In an embodiment, a clock recovery module (not shown) is used to determine the frequency error between the output of DPLL 310 and the extracted clock and to adjust the clock signal provided at the output of DPLL 310 using a phase control signal as illustrated in FIG. 3. A typically clock recovery module may include a similar architecture as DPLL 310.

In a further embodiment, the same clock recovery module used to determine the frequency error between the output of DPLL 310 and the extracted clock is configured to detect a drift in the extracted clock signal and, based on the drift, determine whether there is a failure in generating the extracted clock signal. For example, the extracted clock signal may have become disconnected at the remote node in the event drift is detected. In yet another embodiment, the drift detection is performed on the slave clock signal generated at the output of phase rotator 315.

Second multiplexer 320 receives both the intermediate clock signal and the slave clock signal and selects between these two signals based on a timing-master/timing-slave control signal provided by a control module (not shown). The timing-master/timing-slave control signal is controlled based on whether the Ethernet node, containing transmit clock generation module 300, is currently operating as a timing master or a timing slave, as noted above. If the Ethernet node containing transmit clock generation module 300 is currently operating as a timing master, the intermediate clock signal is selected from the output of DPLL 310, else the slave clock signal from the output of phase rotator 315 is selected. The selected clock signal at the output of second multiplexer 320 is used as the transmit clock for sending data to remote Ethernet nodes.

In an embodiment, if the Ethernet node, containing transmit clock generation module 300, is currently operating as a timing slave, and a drift is detected in either the slave clock signal or the extracted clock signal, the Ethernet node, containing transmit clock generation module 300, is dynamically switched to operate as a timing master.

Switching the configuration of the Ethernet node containing timing generation module 300 from timing master to timing slave, or vice-versa, can be accomplished by controlling the timing-master/timing-slave control signal coupled to second multiplexer 320. The switch can be perforated without re-performing the auto-negotiation process.

Figure 4:
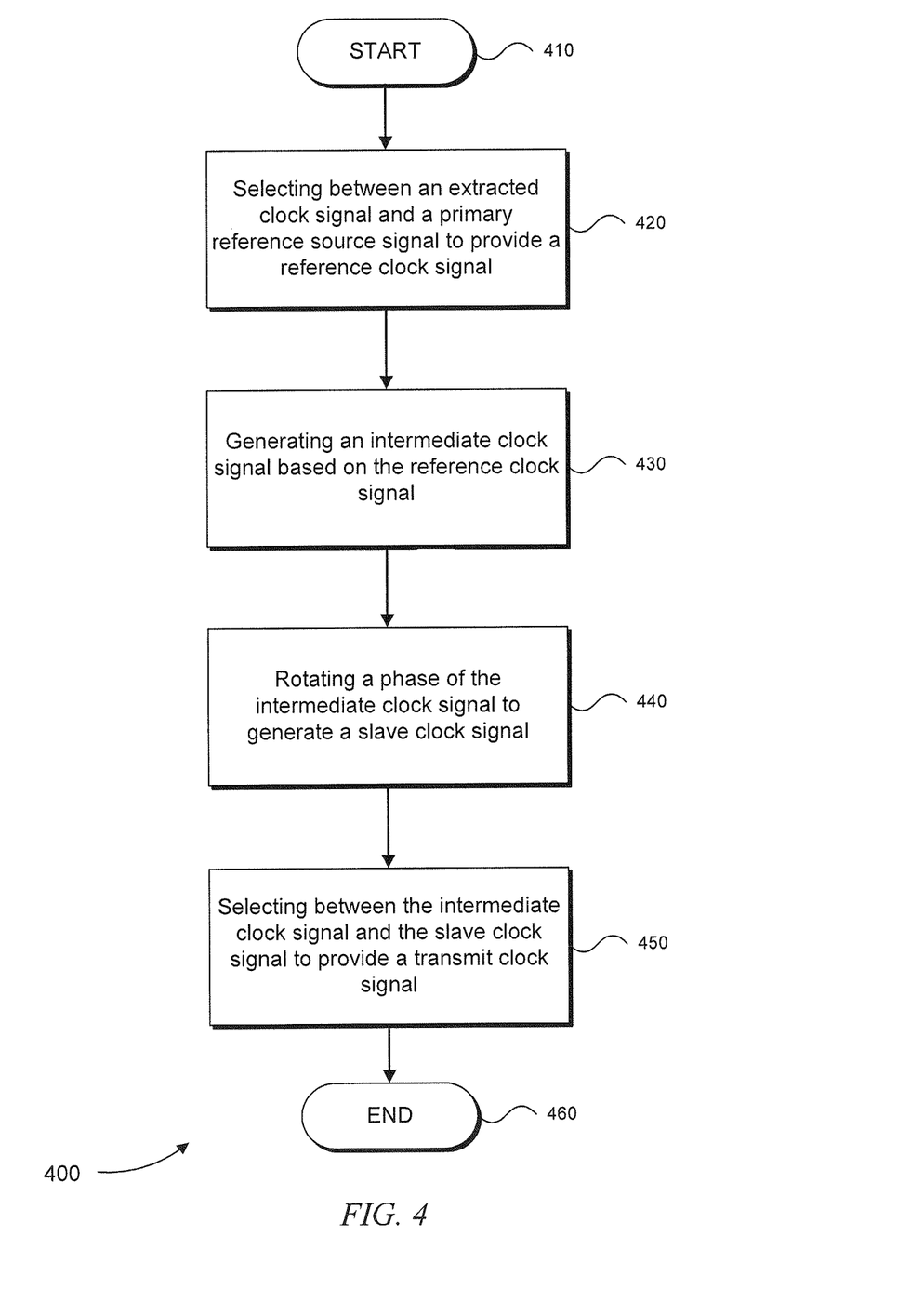
FIG. 4 illustrates a method for dynamically generating a transmit clock, in a dual-master mode Ethernet node, based on either an extracted clock or a primary reference source without re-performing the auto-negotiation process, according to embodiments of the present invention.

FIG. 4 illustrates a method 400 for dynamically generating a transmit clock, in a dual-master mode Ethernet node, based on either an extracted clock or a primary reference source without re-performing the auto-negotiation process, according to embodiments of the present invention.

Method 400 begins at step 410 and proceeds to step 420. At step 420 a selection is made between an extracted clock signal, recovered from a data signal received at the Ethernet node implementing method 400, and a primary reference source (PRC) signal to provide a reference clock signal to a DPLL. The extracted clock signal is selected when the Ethernet node implementing method 400 is operating as a timing slave and the PRC signal is selected when the Ethernet node implementing method 400 is operating as a timing master. In an embodiment, a DPLL, such as DPLL 310 in FIG. 3, can determine if the PRC signal deteriorates and/or becomes disconnected and signal to a control module to switch over to the extracted clock signal in the event that such deterioration or disconnection occurs while the Ethernet node is operating as a timing master.

After the selection step at 420, method 400 proceeds to step 430. At step 430, an intermediate clock signal is generated based on the reference clock signal. In an embodiment, a DPLL is used to generate the intermediate clock signal, such as DPLL 310 in FIG. 3. In a further embodiment, the DPLL has a low-pass filter that only provides a proportion (i.e., a gain or attenuation) and not an integral (i.e., low-pass filter response) correction. Removal of the integral correction can allow the Ethernet node to smoothly transition from being a timing master to a timing slave, or vice-versa.

After step 430, method 400 proceeds to step 440. At step 440 a phase of the intermediate clock signal is rotated based on a frequency error between it and the clock signal extracted from the data received at the Ethernet node implementing method 400. The data in which the clock signal is extracted is received from a remote Ethernet node. The phase rotated signal represents a slave clock signal. In an embodiment, if the Ethernet node, implementing method 400, is currently operating as a timing slave and a drift is detected in either the slave clock signal or the extracted clock signal, the Ethernet node can be dynamically switched to operate as a timing master.

After step 440, method 400 proceeds to step 450. At step 450 a selection is made between the intermediate clock signal and the slave clock signal based on whether the Ethernet node, implementing method 400, is operating as a timing master or a timing slave. If operating as a timing master, the intermediate clock signal (generated based on the PRC signal) is selected, and if operating as a timing slave, the slave clock signal (generated based on the extracted clock signal) is selected. The selected clock signal is then used as the transmit clock for transmitting data to remote Ethernet nodes.

Finally, after step 450, method 400 ends at step 460.

It is to be appreciated that the Detailed Description section, and not the Abstract section, is intended to be used to interpret the claims. The Abstract section may set forth one or more but not all exemplary embodiments of the present invention as contemplated by the inventor(s), and thus, is not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A dual-master mode Ethernet node, comprising:
    a first multiplexer configured to select between an extracted clock signal and a primary reference source (PRS) signal based on whether the dual-master mode Ethernet node is operating as a timing-master or a timing-slave to provide a reference clock signal;
    a phase-locked loop (PLL) configured to generate an intermediate clock signal based on the reference clock signal;
    a phase rotator configured to rotate a phase of the intermediate clock signal based on a frequency error between the intermediate clock signal and the extracted clock signal to generate a slave clock signal; and
    a second multiplexer configured to select between the intermediate clock signal and the slave clock signal based on whether the dual-master mode Ethernet node is operating as the timing-master or the timing-slave to provide a transmit clock signal.

2. The dual-master mode Ethernet node of claim 1, further comprising a transmitter configured to transmit data to a remote dual-master Ethernet node based on the transmit clock signal.

3. The dual-master mode Ethernet node of claim 2, further comprising a clock recovery module configured to generate the extracted clock signal from data received from the remote dual-master mode Ethernet node.

4. The dual-master mode Ethernet node of claim 3, wherein the clock recovery module is configured to detect a drift in the extracted clock signal and, based on the drift, determine whether there is a failure in generating the extracted clock.

5. The dual-master mode Ethernet node of claim 4, wherein the second multiplexer is configured to select the intermediate clock signal to provide the transmit clock signal if the clock recovery module determines there is a failure in generating the extracted clock.

6. The dual-master mode Ethernet node of claim 1, wherein the PLL is configured to monitor a quality of the reference clock signal to determine if the reference clock signal has deteriorated beyond an acceptable amount.

7. The dual-master mode Ethernet node of claim 6, wherein the second multiplexer is configured to select the slave clock signal to provide the transmit clock signal if the PLL determines that the reference clock signal has deteriorated beyond the acceptable amount.

8. A method of controlling a dual-master mode Ethernet node, the method comprising:
    selecting between an extracted clock signal and a primary reference source (PRS) signal based on whether the dual-master mode Ethernet node is operating as a timing-master or a timing-slave to provide a reference clock signal;
    generating an intermediate clock signal based on the reference clock signal;
    rotating a phase of the intermediate clock signal based on a frequency error between the intermediate clock signal and an extracted clock signal to generate a slave clock signal; and
    selecting between the intermediate clock signal and the slave clock signal based on whether the dual-master mode Ethernet node is operating as the timing-master or the timing-slave to provide a transmit clock signal.

9. The method of claim 8, further comprising:
    generating the extracted clock signal from data received from a remote dual-master mode Ethernet node.

10. The method of claim 9, further comprising:
    detecting a drift in the extracted clock signal and, based on the drift, determining whether there is a failure in generating the extracted clock.

11. The method of claim 10, wherein the step of selecting between the intermediate clock signal and the slave clock signal to provide the transmit clock signal further comprises:
    selecting the intermediate clock signal to provide the transmit clock signal if there is a failure in generating the extracted clock.

12. The method of claim 8, further comprising:
monitoring a quality of the reference clock signal to determine if the reference clock signal has deteriorated beyond an acceptable amount.

13. The method of claim 12, wherein the step of selecting between the intermediate clock signal and the slave clock signal to provide the transmit clock signal further comprises:
selecting the slave clock signal to provide the transmit clock signal if the reference clock, signal has deteriorated beyond the acceptable amount.

14. A synchronous Ethernet network, comprising:
a first Ethernet node; and
a second Ethernet node configured to communicate with the first Ethernet node,
wherein the first Ethernet node, after completing an auto negotiation process with the second Ethernet node, is configured to generate a transmit clock from a first primary reference source (PRS) signal, and the second Ethernet node, after completing the auto-negotiation process with the first Ethernet node, is configured to recover the transmit clock from data received from the first Ethernet node,
wherein if a quality of the first PRS signal deteriorates beyond an acceptable amount at the first Ethernet node:
the second Ethernet node is configured to switch from recovering the transmit clock from the data received from the first Ethernet node to generating the transmit clock from a second PRS signal without re-performing the auto-negotiation process, and
the first Ethernet node is configured to switch from generating the transmit clock from the first PRS signal to recovering the transmit clock from data received from the second Ethernet node without re-performing the auto-negotiation process.

15. The synchronous Ethernet network of claim 14, wherein the first PRS signal and the second PRS signal are identical.

16. The synchronous Ethernet network of claim 14, wherein the first Ethernet node comprises:
a first multiplexer configured to select between an extracted clock signal and the first PRS signal to provide a reference clock signal.

17. The synchronous Ethernet network of claim 16, wherein the first Ethernet node further comprises:
a phase-locked loop (PLL) configured to generate an intermediate clock signal based on the reference clock signal.

18. The synchronous Ethernet network of claim 17, wherein the first Ethernet node further comprises:
a phase rotator configured to rotate a phase of the intermediate clock signal based on a frequency error between the intermediate clock signal and the extracted clock signal to generate a slave clock signal.

19. The synchronous Ethernet network of claim 16, wherein the first Ethernet node further comprises:
a second multiplexer configured to select between the intermediate clock signal and the slave clock signal to provide the transmit clock signal.

\* \* \* \* \*

UNITED STATES PATENT AND TRADEMARK OFFICE
CERTIFICATE OF CORRECTION

| | | |
|---|---|---|
| PATENT NO. | : 8,619,755 B2 | Page 1 of 1 |
| APPLICATION NO. | : 12/983600 | |
| DATED | : December 31, 2013 | |
| INVENTOR(S) | : Peiqing Wang | |

It is certified that error appears in the above-identified patent and that said Letters Patent is hereby corrected as shown below:

In the Claims

Column 11, line 9 please replace "clock, signal" with --clock signal--.

Signed and Sealed this
Ninth Day of September, 2014

Michelle K. Lee
*Deputy Director of the United States Patent and Trademark Office*